US009903651B2

United States Patent
Jun et al.

(10) Patent No.: US 9,903,651 B2
(45) Date of Patent: Feb. 27, 2018

(54) SEALING MEMBER AND SUBSTRATE PROCESSING APPARATUS INCLUDING THE SAME

(71) Applicants: Yong-Myung Jun, Hwaseong-si (KR); Yong-Sun Ko, Suwon-si (KR); Kun-Tack Lee, Suwon-si (KR); Il-Sang Lee, Hwaseong-si (KR); Ji-Hoon Jeong, Suwon-si (KR); Yong-Jhin Cho, Hwaseong-si (KR); Jin-Suk Hong, Hwaseong-si (KR)

(72) Inventors: Yong-Myung Jun, Hwaseong-si (KR); Yong-Sun Ko, Suwon-si (KR); Kun-Tack Lee, Suwon-si (KR); Il-Sang Lee, Hwaseong-si (KR); Ji-Hoon Jeong, Suwon-si (KR); Yong-Jhin Cho, Hwaseong-si (KR); Jin-Suk Hong, Hwaseong-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 485 days.

(21) Appl. No.: 14/556,969

(22) Filed: Dec. 1, 2014

(65) Prior Publication Data
US 2015/0176897 A1    Jun. 25, 2015

(30) Foreign Application Priority Data
Dec. 23, 2013 (KR) .................. 10-2013-0161314

(51) Int. Cl.
F26B 25/00    (2006.01)
F26B 25/14    (2006.01)
(Continued)

(52) U.S. Cl.
CPC ........... *F26B 25/008* (2013.01); *F16J 15/022* (2013.01); *F26B 25/14* (2013.01);
(Continued)

(58) Field of Classification Search
USPC ....... 277/312, 650, 590, 628, 637, 641, 642, 277/644; 118/715, 733
See application file for complete search history.

(56) References Cited

U.S. PATENT DOCUMENTS 3,385,543 A * 5/1968 Jakel .................... B04B 9/12
267/141
4,078,813 A * 3/1978 Bram .................. F16J 15/022
277/616
(Continued)

FOREIGN PATENT DOCUMENTS

JP    H09133186 A    5/1997
JP    2012092976 A    5/2012
(Continued)

*Primary Examiner* — Jeffrie R Lund
(74) *Attorney, Agent, or Firm* — Harness, Dickey & Pierce, P.L.C.

(57) ABSTRACT

A sealing member includes a body having a ring shape, a lower contacting portion protruding from a lower end of the body and having at least one recess, the recess provided in a lower surface of the lower contacting portion and extending in a radial direction of the body, and an outer contacting portion protruding outwards from the body along an outer side portion of the body.

20 Claims, 12 Drawing Sheets

(51) Int. Cl.
  *F16J 15/02* (2006.01)
  *H01L 21/67* (2006.01)
  *C23C 16/44* (2006.01)

(52) U.S. Cl.
  CPC .. *H01L 21/67017* (2013.01); *H01L 21/67028* (2013.01); *H01L 21/67034* (2013.01); *C23C 16/4409* (2013.01)

(56) References Cited

U.S. PATENT DOCUMENTS

| | | | |
|---|---|---|---|
| 4,252,332 A * | 2/1981 | Nakayama | F16J 15/32 277/641 |
| 5,944,323 A * | 8/1999 | Cavka | F16J 15/025 277/602 |
| 8,414,705 B2 | 4/2013 | Nakagawa | |
| 8,814,173 B2 * | 8/2014 | Motzkus | F01D 11/005 277/626 |
| 2012/0223521 A1 | 9/2012 | Kota | |
| 2013/0042765 A1 * | 2/2013 | Chameroy | A47J 27/0804 99/337 |
| 2014/0291421 A1 * | 10/2014 | Kim | H01L 21/67017 239/565 |
| 2014/0374994 A1 * | 12/2014 | Monteil | F16L 17/035 277/314 |
| 2015/0176897 A1 * | 6/2015 | Jun | F26B 25/008 34/218 |
| 2015/0303036 A1 * | 10/2015 | Jeong | H01J 37/32513 156/345.1 |

FOREIGN PATENT DOCUMENTS

| | | |
|---|---|---|
| JP | 2012180933 A | 9/2012 |
| JP | 2012225367 A | 11/2012 |
| KR | 20060021740 A | 3/2006 |
| KR | 20070058876 A | 6/2007 |
| KR | 20080088706 A | 10/2008 |
| KR | 20080095950 A | 10/2008 |
| KR | 101192986 B1 | 10/2012 |

* cited by examiner

SEALING MEMBER AND SUBSTRATE PROCESSING APPARATUS INCLUDING THE SAME

PRIORITY STATEMENT

This application claims priority under 35 U.S.C. § 119 to Korean Patent Application No. 10-2013-0161314, filed on Dec. 23, 2013 in the Korean Intellectual Property Office (KIPO), the contents of which are herein incorporated by reference in their entirety.

BACKGROUND

1. Field

Example embodiments relate to a sealing member and a substrate processing apparatus including the sealing member. More particularly, example embodiments relate to a sealing member used to seal a chamber for processing a substrate using a supercritical fluid, and a substrate processing apparatus including the same.

2. Description of the Related Art

In the field of integrated semiconductor device manufacture, a supercritical fluid may be used to physically and chemically process fine semiconductor patterns.

A supercritical fluid is any substance at a temperature and pressure above its critical point, where distinct liquid and gas phases do not exist. The supercritical fluid may have unique properties as compared to a gas and a liquid, including low surface tension, low viscosity, high solvency, and/or high diffusion coefficient with applications in the field of integrated semiconductor device manufacture. However, since a supercritical fluid process may be performed under high pressure, a sealing member for efficiently seal a supercritical fluid process chamber may be required.

SUMMARY

Some example embodiments provide a sealing member capable of reliably sealing a chamber for a supercritical fluid process.

Some example embodiments provide a substrate processing apparatus including the sealing member.

According to some example embodiments, a sealing member includes a body having a ring shape, a lower contacting portion protruding from a lower end of the body and having at least one recess, the recess provided in a lower surface of the lower contacting portion and extending in a radial direction of the body, and an outer contacting portion protruding outwards from the body along an outer side portion of the body.

In some example embodiments, a plurality of the recesses may be arranged to be spaced apart from each other along a circumferential direction of the body.

In some example embodiments, the sealing member may include an indentation which is defined by a lower surface of the outer contacting portion and an outer surface of the lower contacting portion, the indentation extending in a circumferential direction of the body.

In some example embodiments, the indentation may be connected to the recess.

In some example embodiments, the indentation may be provided in an edge of an outer lower portion of the sealing member.

In some example embodiments, the recess may have a first depth from the lower surface of the lower contacting portion, and the indentation may have a second depth from a plane having the lower surface of the lower contact portion, the second depth being substantially the same as or greater than the first depth.

In some example embodiments, an outer surface of the outer contacting portion may form an acute inclination angle with respect to a plane having the lower surface of the lower contacting portion.

In some example embodiments, an inner side portion of a vertical sectional profile of the sealing member may have a linear or curvilinear shape.

In some example embodiments, the sealing member may include polymer material having elasticity.

According to some example embodiments, a substrate processing apparatus includes a process chamber including a lower chamber and an upper chamber which are combined to provide a substrate processing space, and a sealing member configured to be seated in a receiving groove formed in at least one of mating surfaces of the lower chamber and the upper chamber opposite to each other and compressed between the upper chamber and the lower chamber to seal the space. The sealing member includes a body seated in the receiving groove and having a ring shape, a lower contacting portion protruding from a lower end of the body and having at least one recess, the recess provided in a lower surface of the lower contacting portion and extending in a radial direction of the body, and an outer contacting portion protruding outwards from the body along an outer side portion of the body.

In some example embodiments, the sealing member may include an indentation which is defined by a lower surface of the outer contacting portion and an outer surface of the lower contacting portion, the indentation extending in a circumferential direction of the body.

In some example embodiments, the indentation may be connected to the recess.

In some example embodiments, the recess may have a first depth from a bottom face of the receiving groove, and the indentation may have a second depth from the bottom face of the receiving groove, the second depth being substantially the same as or greater than the first depth.

In some example embodiments, the indentation may be provided in an edge of an outer lower portion of the sealing member.

In some example embodiments, the substrate processing apparatus may further include a supply port supplying a supercritical fluid into the process chamber, and an exhaust port exhausting from the supercritical fluid from the process chamber.

In some example embodiments, the supply port may include a first supply port in the lower chamber and a second supply port installed in the upper chamber.

In some example embodiments, the exhaust port may be in the lower chamber.

In some example embodiments, the substrate processing apparatus may further include a substrate supporting member provided in the process chamber to support a substrate in the process chamber.

In some example embodiments, the substrate supporting member may extend from a lower surface of the upper chamber.

In some example embodiments, an outer sidewall of the receiving groove may have a first height from a bottom face of the receiving groove, and an inner sidewall of the receiving groove may have a second height from the bottom face of the receiving groove.

According to some example embodiments, the sealing member may reduce or prevent particles from being generating in a supercritical fluid process chamber and provide an improved seal for the fluid of high pressure.

According to some example embodiments, the sealing member may comprise a deformable body, a first contacting portion of the deformable body including at least one recess, and a second contacting portion of the deformable body including at least one indentation, the at least one recess, the at least one indentation and a receiving groove of a process chamber forming an auxiliary space in which reaction byproducts are collected and flushed out of the process chamber.

In some example embodiments, the sealing member, wherein a plurality of the recesses is arranged to be spaced apart from each other along a circumferential direction of the body In some example embodiments, the sealing member, wherein the at least one indentation is provided in an edge of the second contacting portion of the sealing member.

In some example embodiments, the sealing member, wherein the at least one recess has a first depth from a lower surface of the first contacting portion, and the indentation has a second depth from a plane having the lower surface of the first contact portion, the second depth being substantially the same as or greater than the first depth.

According to some example embodiments, a method of decontaminating a process chamber includes positioning a sealing member in the receiving groove, the sealing member including at least one recess and at least one indentation, the at least one recess, the at least one indentation, and the receiving groove forming an auxiliary space; pressurizing a main space of the process chamber to deform the sealing member to create an air tight seal, conducting the pressurized reaction in the main space of the process chamber, collecting reaction byproducts from the pressurized reaction in the auxiliary space, depressurizing the main space of the process chamber to un-deform the sealing member and remove the air tight seal, and purging the collected reaction byproducts via the auxiliary space.

BRIEF DESCRIPTION OF THE DRAWINGS

Example embodiments will be more clearly understood from the following detailed description taken in conjunction with the accompanying drawings. FIGS. 1 to 11 represent non-limiting, example embodiments as described herein.

FIG. 1 is a perspective view illustrating a sealing member in accordance with some example embodiments.

FIG. 2 is a plan view illustrating the sealing member in FIG. 1.

FIG. 3 is a cross-sectional view taken along the line III-III' in FIG. 2.

FIG. 4 is a cross-sectional view taken along the line IV-IV' in FIG. 2.

FIG. 5 is a partially exploded view illustrating the sealing member in FIG. 1.

FIG. 7 is a cross-sectional view illustrating a sealing member in accordance with some example embodiments.

FIG. 8 is a cross-sectional view illustrating a substrate processing apparatus in accordance with some example embodiments.

FIG. 9 is an enlarged view illustrating the "A" portion in FIG. 8.

FIG. 11 is a flow chart illustrating a method of decontaminating a process chamber of the substrate processing apparatus in FIG. 8.

DETAILED DESCRIPTION OF EXAMPLE EMBODIMENTS

Figure 1:
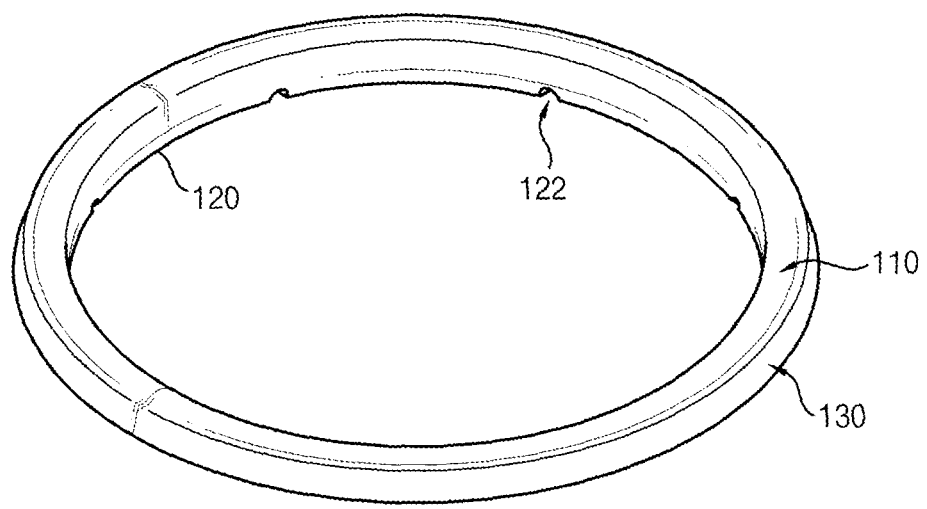

Various example embodiments will be described more fully hereinafter with reference to the accompanying drawings, in which example embodiments are shown. Example embodiments may, however, be embodied in many different forms and should not be construed as limited to example embodiments set forth herein. Rather, these example embodiments are provided so that this disclosure will be thorough and complete, and will fully convey the scope of example embodiments to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

Figure 2:
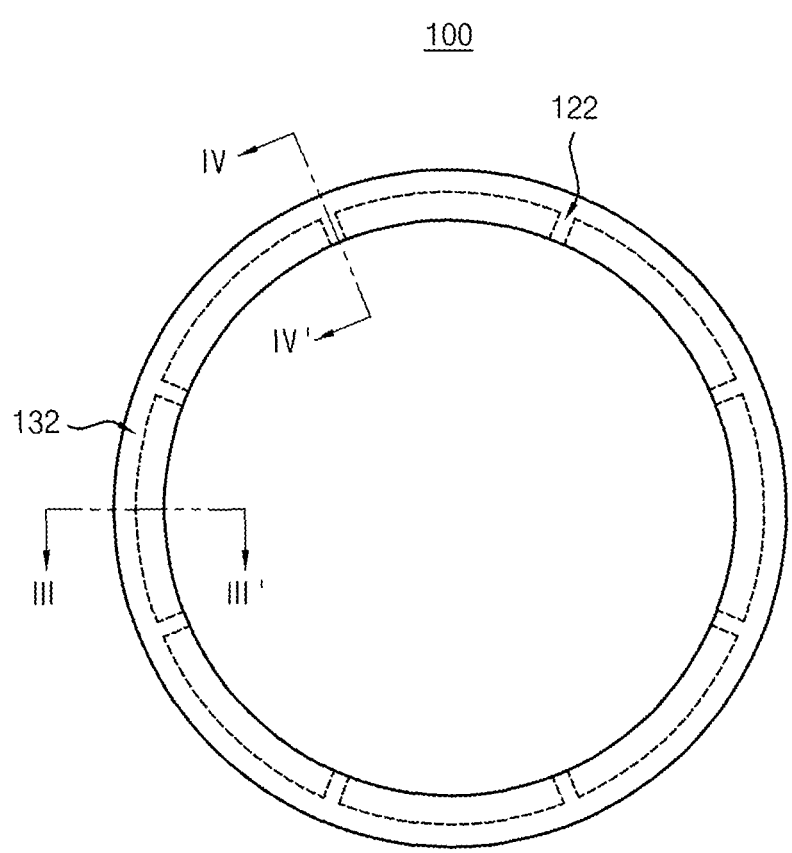
Figure 3:
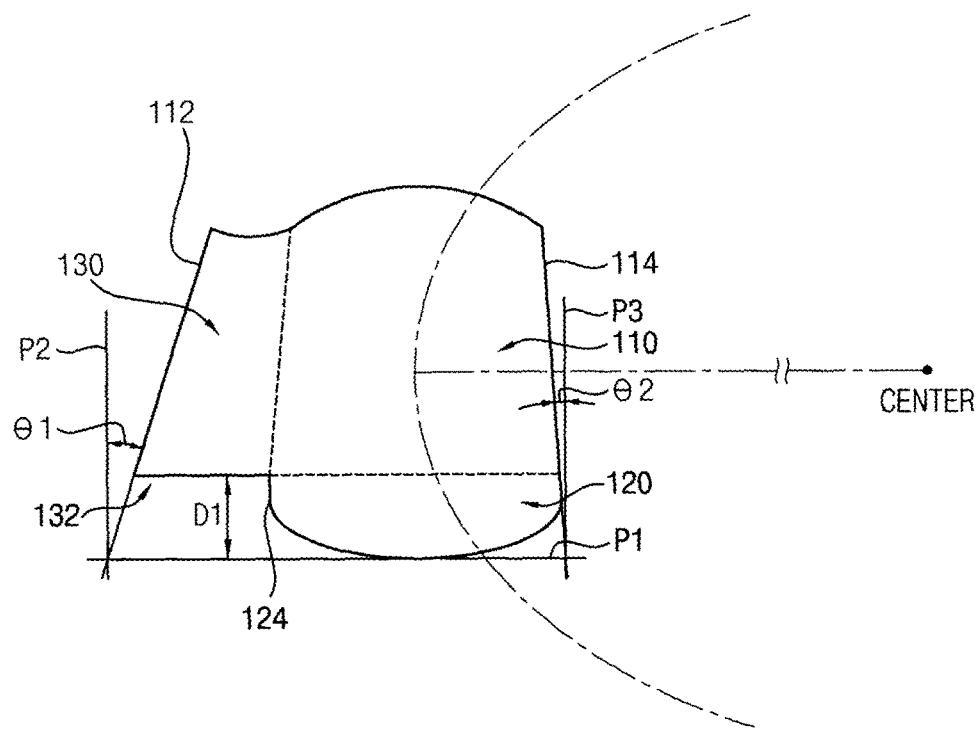
Figure 4:
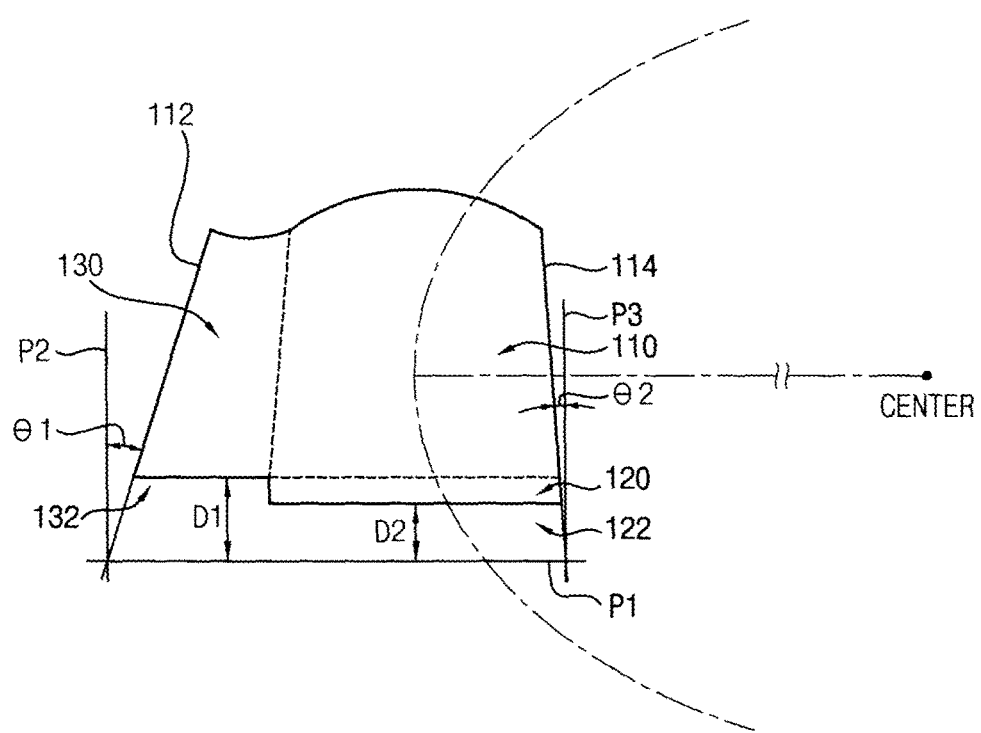
Figure 5:
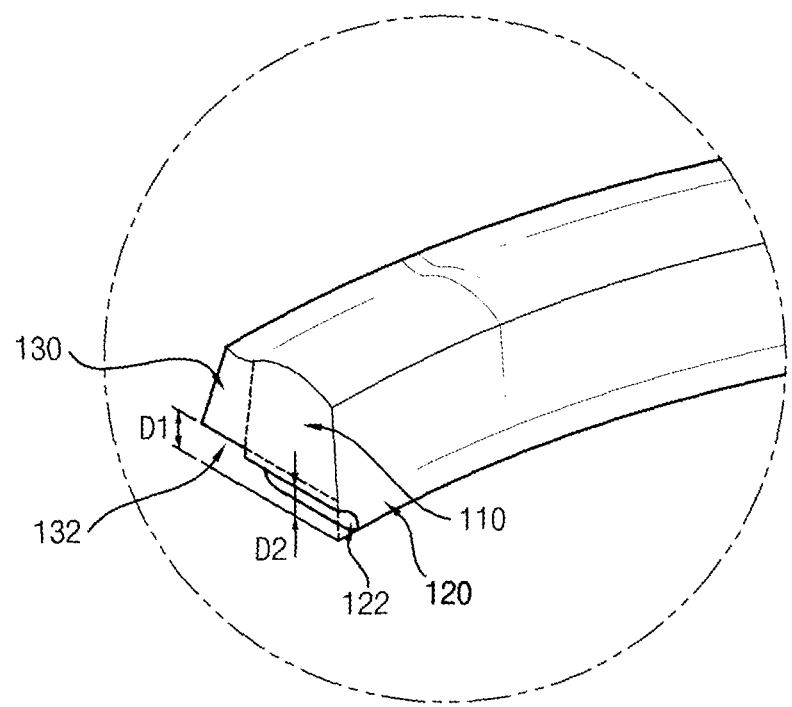
Figure 6A:
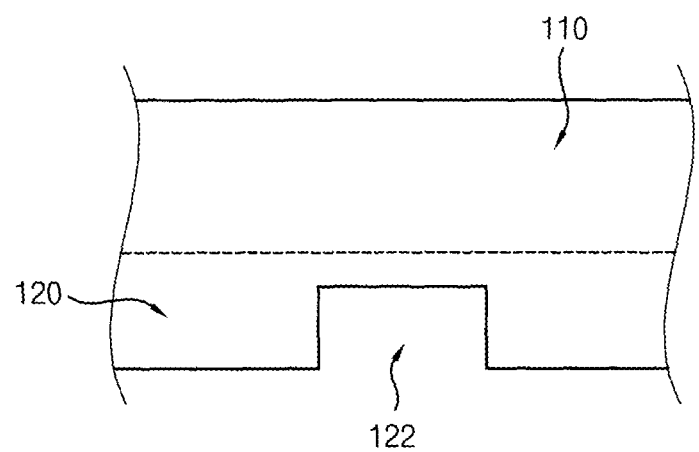
FIGS. 6A to 6G are cross-sectional views illustrating various recesses of a lower contacting portion.
Figure 6B:
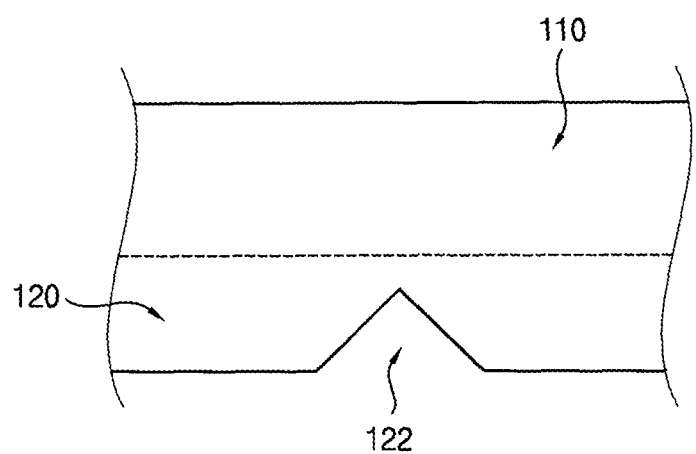
Figure 6C:
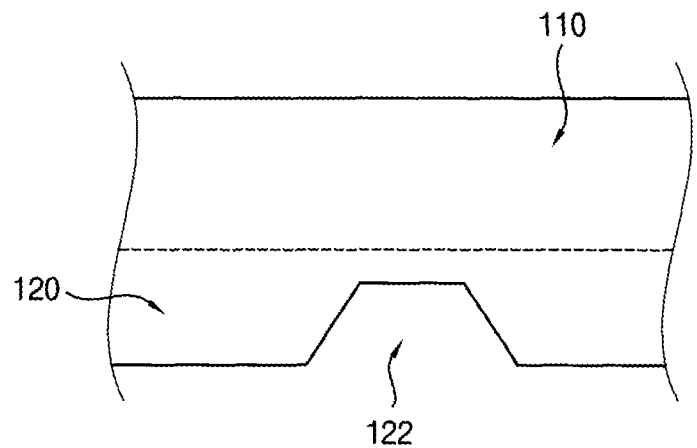
Figure 6D:
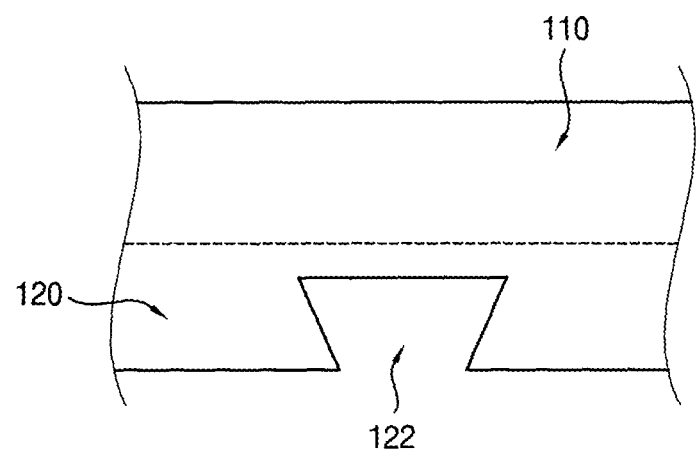
Figure 6E:
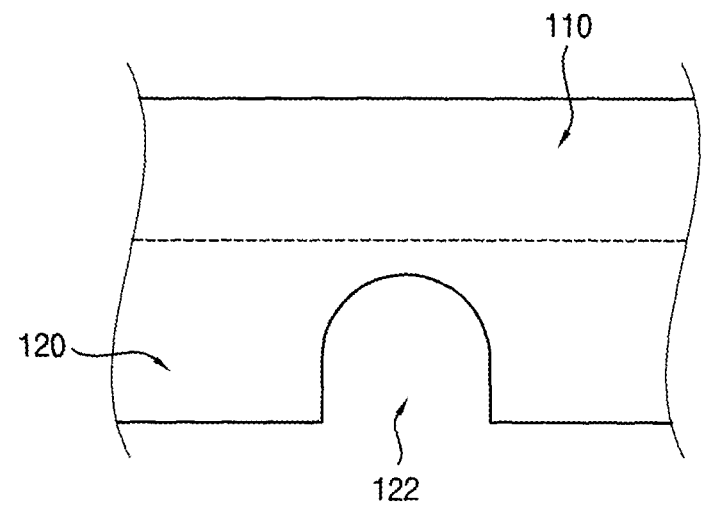
Figure 6F:
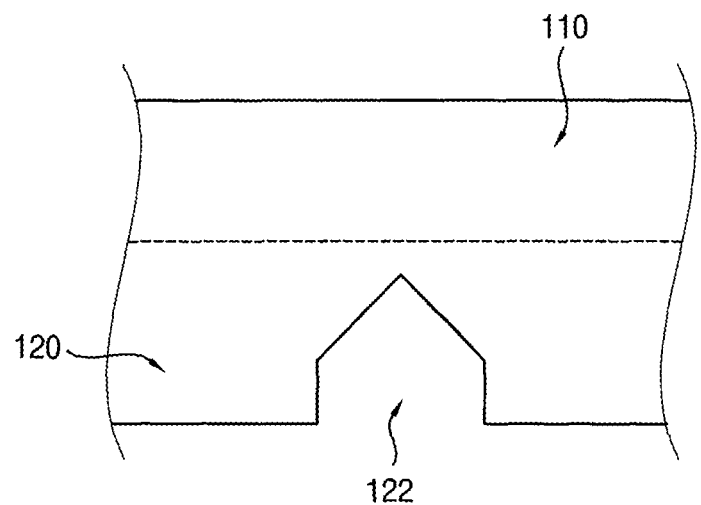
Figure 6G:
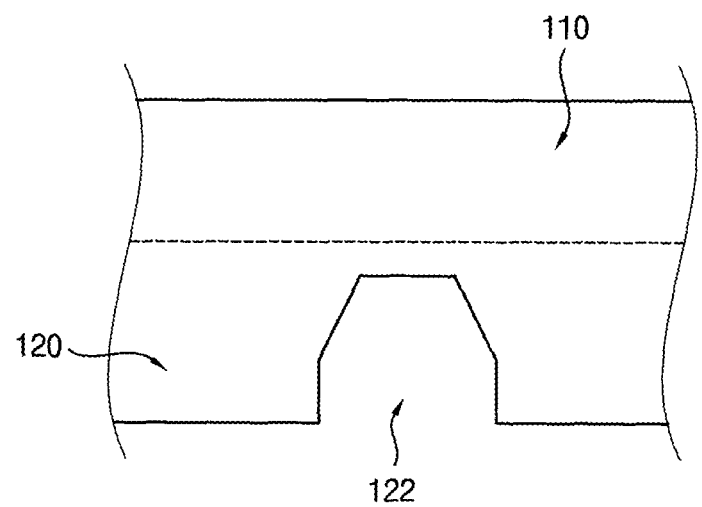

FIG. 1 is a perspective view illustrating a sealing member in accordance with some example embodiments. FIG. 2 is a plan view illustrating the sealing member in FIG. 1. FIG. 3 is a cross-sectional view taken along the line III-III' in FIG. 2. FIG. 4 is a cross-sectional view taken along the line IV-IV' in FIG. 2. FIG. 5 is a partially exploded view illustrating the sealing member in FIG. 1.

Referring to FIGS. 1 to 5, a sealing member 100 may include a body 110, a lower contacting portion 120 (or more generally, a first contacting portion) protruding from a lower end of the body 110 and an outer contacting portion 130 (or more generally, a second contacting portion) protruding outwards from the body 110 along an outer circumference of the body 110.

In some example embodiments, the sealing member 100 may be used for a process chamber for providing a processing space where a manufacturing process for semiconductor devices is performed to airtightly seal the process chamber. However, its use is not limited thereto; the sealing member 100 may be compressed between two or more parts, creating an airtight seal at the interface.

For example, the process chamber may provide an airtight space for performing a drying process. The drying process may be performed using a supercritical fluid on a wet-etched wafer. The sealing member 100 may be seated in a receiving groove that is formed along an edge of a mating surface of the process chamber, thereby reducing or preventing a high pressurized fluid from leaking from the process chamber.

The body 110 may have a ring shape. The body 110 may have substantially a rectangular or trapezoidal cross-sectional shape.

Figure 9:
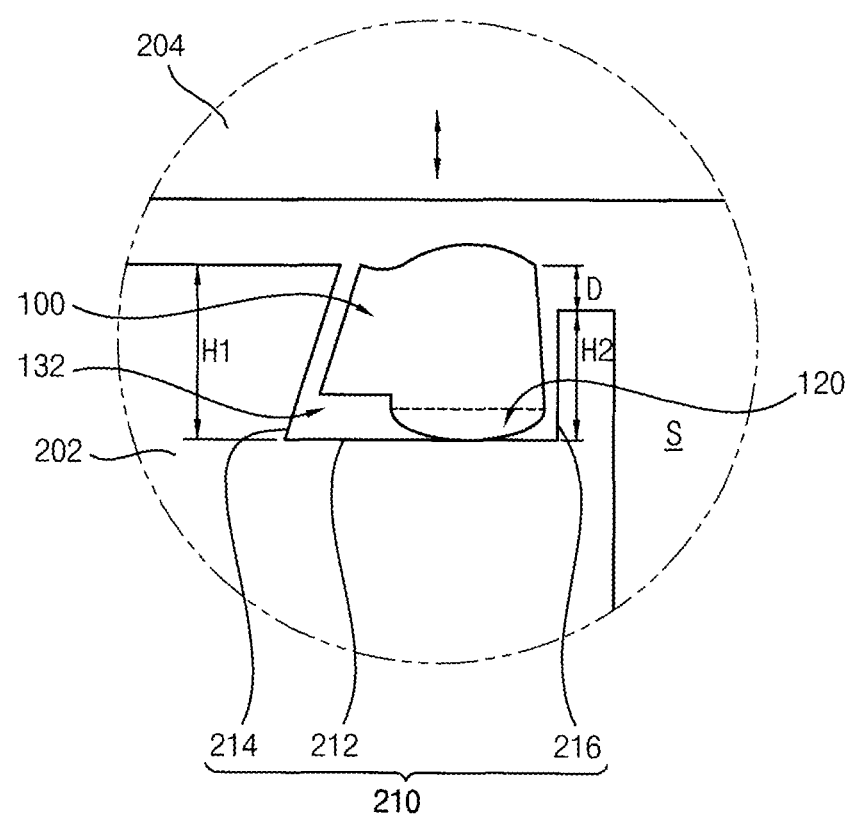

The lower contacting portion 120 may protrude from the lower end of the body 110 to make contact with a bottom face 212 of a receiving groove (See FIG. 9). A lower surface of the lower contacting portion 120 may contact the bottom face of the receiving groove.

At least one recess 122 may be provided in the lower surface of the lower contacting portion 120. The at least one recess 122 may extend in a radial direction of the body 110. The at least one recess 122 may extend from an inner side portion of the lower contacting portion 120 to an outer side portion of the body 110. Accordingly, the at least one recess 122 may extend in a direction perpendicular to an extending direction of the lower contacting portion 120, that is, a circumferential direction of the body 110. The at least one recess 122 in a lower surface of the lower contacting portion 120 may be a pathway recess which is connected to an annular tunnel space R (see FIG. 10B). For example, the at least one recess 122 may have a semicircular cross-sectional shape.

A plurality of the recesses 122 may be arranged along the circumferential direction of the body 110. The number of the plurality of recesses 122 and the spacing distance between the plurality of recesses 122 may be determined in consideration of the size and material of the sealing member 100, the process condition of the process chamber, etc.

The outer contacting portion 130 may protrude outwards from the body 110 along an outer side portion of the body 110 to make contact with an outer sidewall 214 of the receiving groove (See FIG. 9). The outer contacting portion 130 may protrude from at least outer upper portion of the body 110. An outer surface 112 of the outer contacting portion 130 may contact the outer sidewall of a receiving groove of the process chamber.

Accordingly, the sealing member 100 may have an indentation 132 which is defined by a lower surface of the outer contacting portion 130 and an outer surface of the lower contacting portion 120. The indentation 132 may extend in the circumferential direction of the body 110. That is, the lower surface of the outer contacting portion 130 may form a horizontal surface (upper face) of the indentation 132, and the outer surface of the lower contacting portion 120 may form a vertical surface (sidewall) of the indentation 132.

The indentation 132 may extend along an edge of an outer lower portion of the sealing member 100. A plurality of the recesses 122 may be connected to the indentation 132. That is, the indentation 132 may be a tunnel recess for forming an annular tunnel space (or more generally, an auxiliary space) together with a bottom face and the outer sidewall of the receiving groove.

In example embodiments, as illustrated in FIGS. 3 and 4, the indentation 132 may have a first depth D1 from a first plane P1, and the recess 122 may have a second depth D2 from the first plane P1. In at least one example embodiment, the first plane P1 may be a plane having the lower surface of the lower contacting portion 120.

The second depth D2 of the at least one recess 122 may be the same as the first depth D1 of the indentation 132. Alternatively, the second depth D2 of the at least one recess 122 may be less than or greater than the first depth D1 of the indentation 132.

An outer side portion of a vertical sectional profile of the outer contacting portion 130 may have a linear shape. The outer surface 112 of the outer contacting portion 130, that is, an outer surface of the sealing member 100 may be inclined with respect to the first plane P1. An inner portion of the vertical sectional profile of the body 110 may have a linear shape. An inner surface 114 of the body 110, that is, an inner surface of the sealing member 100 may be inclined with respect to the first plane P1.

For example, the outer surface 112 of the outer contacting portion 130 may form a first inclination angle θ1 with respect to a second plane P2 perpendicular to the first plane P1. The first inclination angle θ1 may be an acute angle. The inner surface 114 of the body 110 may form a second inclination angle θ2 with respect to a third plane P3 perpendicular to the first plane P1 and parallel with the second plane P2. The second inclination angle θ2 may be an acute angle. The first inclination angle θ1 may be greater than the second inclination angle θ2.

Accordingly, when the process chamber is opened or closed, the sealing member 100 may remain in the receiving groove.

The body 110 may be formed using polymer material having elasticity. The lower contacting portion 120 and the outer contacting portion 130 may be integrally formed with the body 110. Examples of the polymer material may be perfluoroalkoxy (PFA), polytetrafluorethylene (PTFE), polyimide (PI), polyethylene (PE), polychlorotrifluoroethene (PCTFE), urethane, etc.

FIGS. 6A to 6G are cross-sectional views illustrating various recesses of a lower contacting portion 120.

Referring to FIGS. 6A to 6G, the at least one recess 122 formed in a lower surface of a lower contacting portion 120 may have various cross-sectional shapes such as a rectangle, triangle, trapezoid, pentagon, hexagon, arch, etc.

Figure 7:
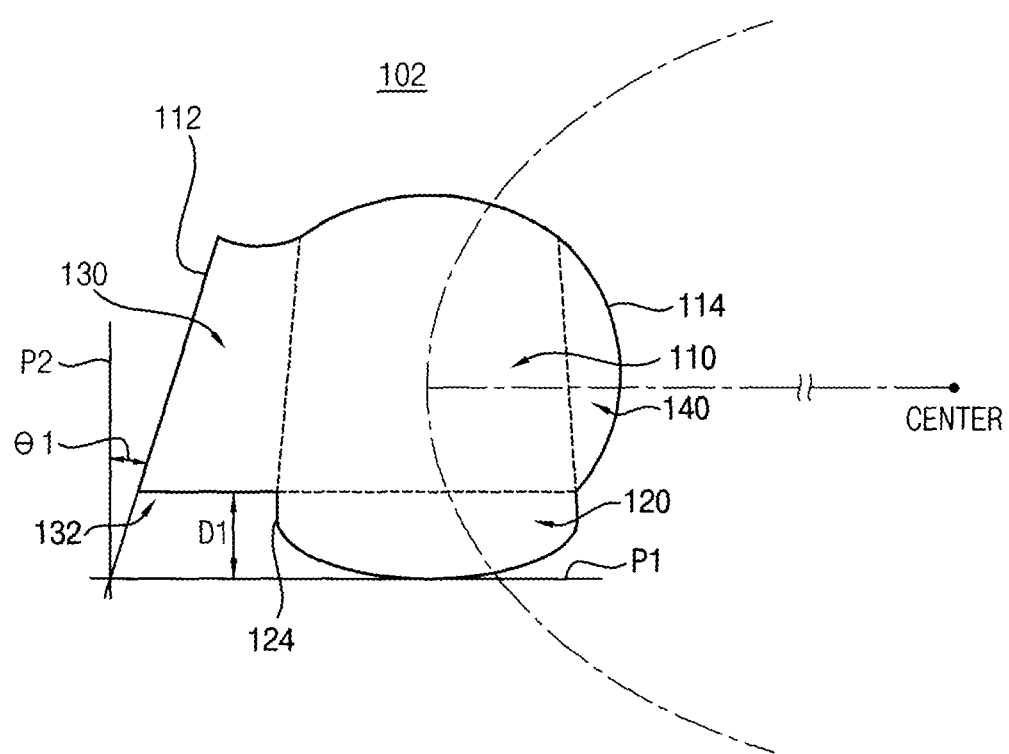

FIG. 7 is a cross-sectional view illustrating a sealing member 102 in accordance with example embodiments. FIG. 7 is a cross-sectional view taken along the line III-III' in FIG. 2. The sealing member 102 is substantially the same as the sealing member 100 described with reference to FIGS. 1 to 5 except for an inner contacting portion 140. Thus, the same reference numerals will be used to refer to the same or like elements and any further repetitive explanation concerning the above elements will be omitted.

Referring to FIG. 7, a sealing member 102 may include a body 110, a lower contacting portion 120 protruding from a lower end of the body 110, an outer contacting portion 130 protruding outwards from the body 110 along an outer circumference of the body 110, and an inner contacting portion 140 protruding inwards from the body 110 along an inner circumference of the body 110.

In example embodiments, the inner contacting portion 140 may protrude inwards from the body 110 along an inner side portion of the body 110 to face, but not necessarily contact, an inner sidewall 216 of a receiving groove of the process chamber (see FIG. 9).

An inner side portion of a vertical sectional profile of the inner contacting portion 140 may have a curvilinear shape. An inner surface 114 of the inner contacting portion 140, that is, an inner surface of the sealing member 100 may have a curved shape.

Additionally, it will be understood that the sealing member 102 may further have an upper contacting portion protruding from an upper portion of the body 110.

Hereinafter, a substrate processing apparatus including the sealing member in FIG. 1 will be explained.

Figure 8:
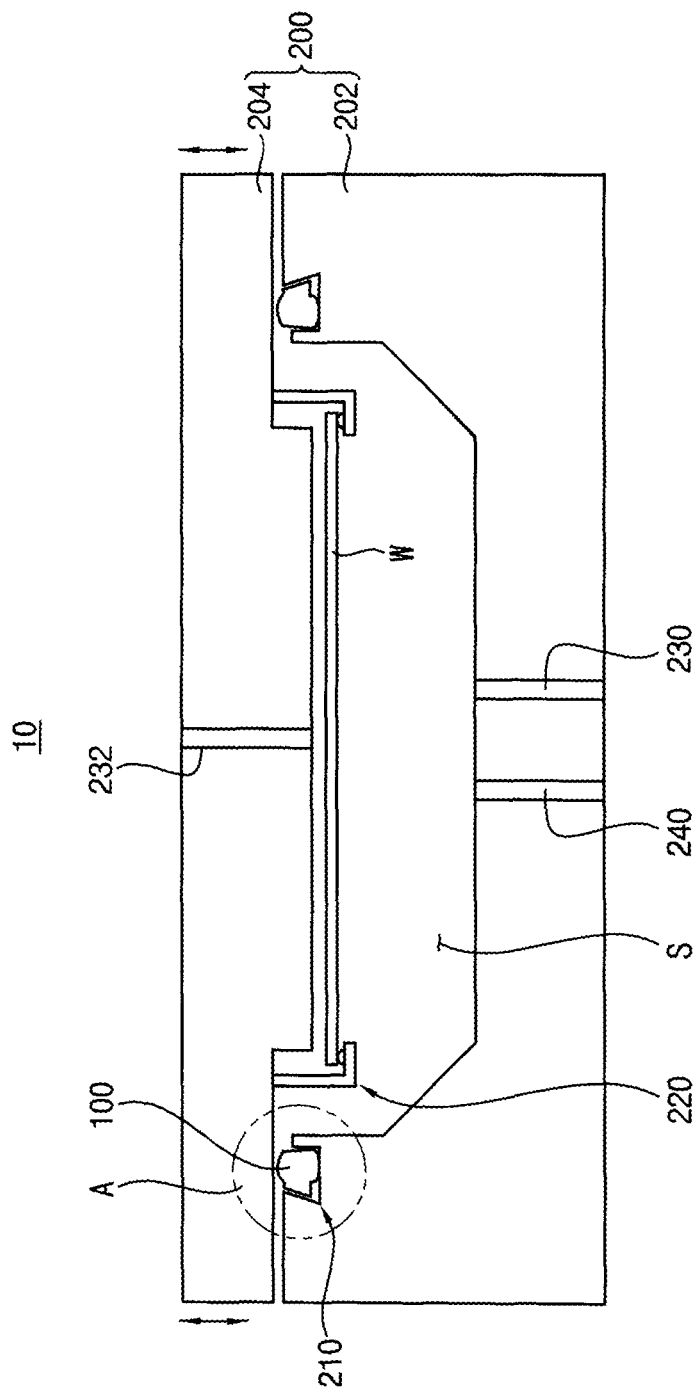
Figure 10A:
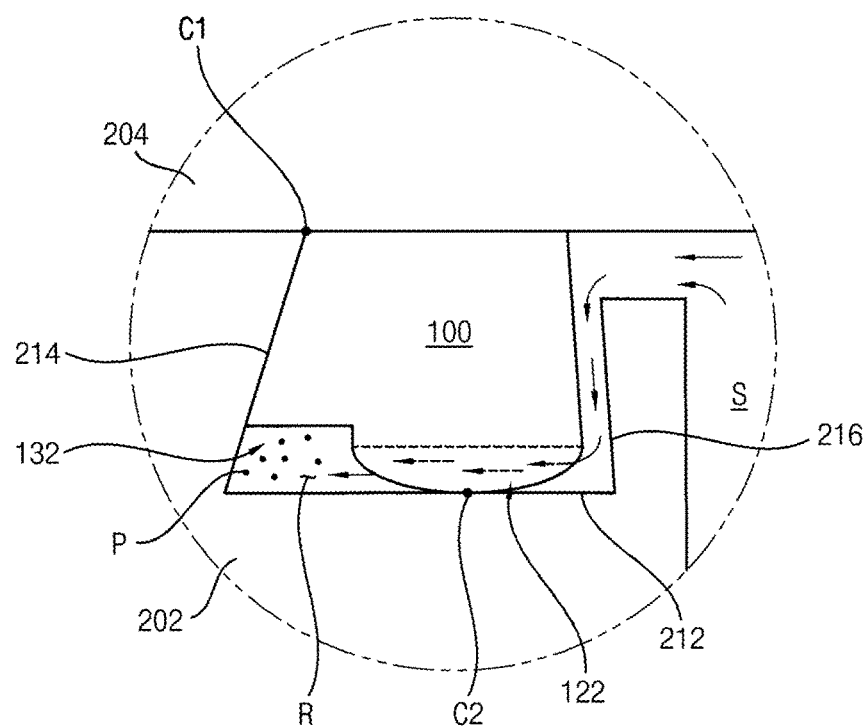
FIGS. 10A and 10B are cross-sectional views illustrating shapes of a sealing member when a process is performed in a process chamber of the substrate processing apparatus in FIG. 8.
Figure 10B:
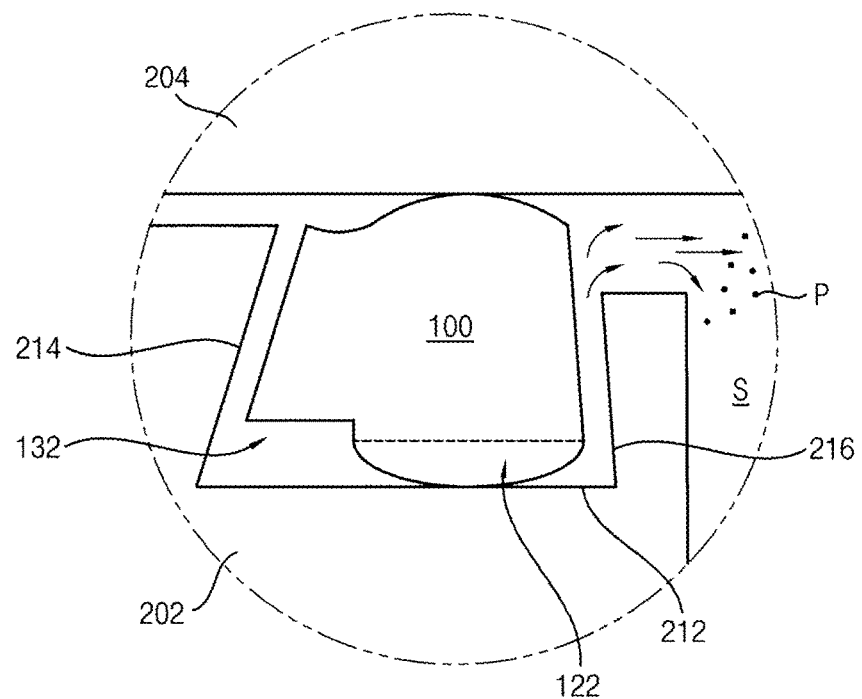
Figure 11:
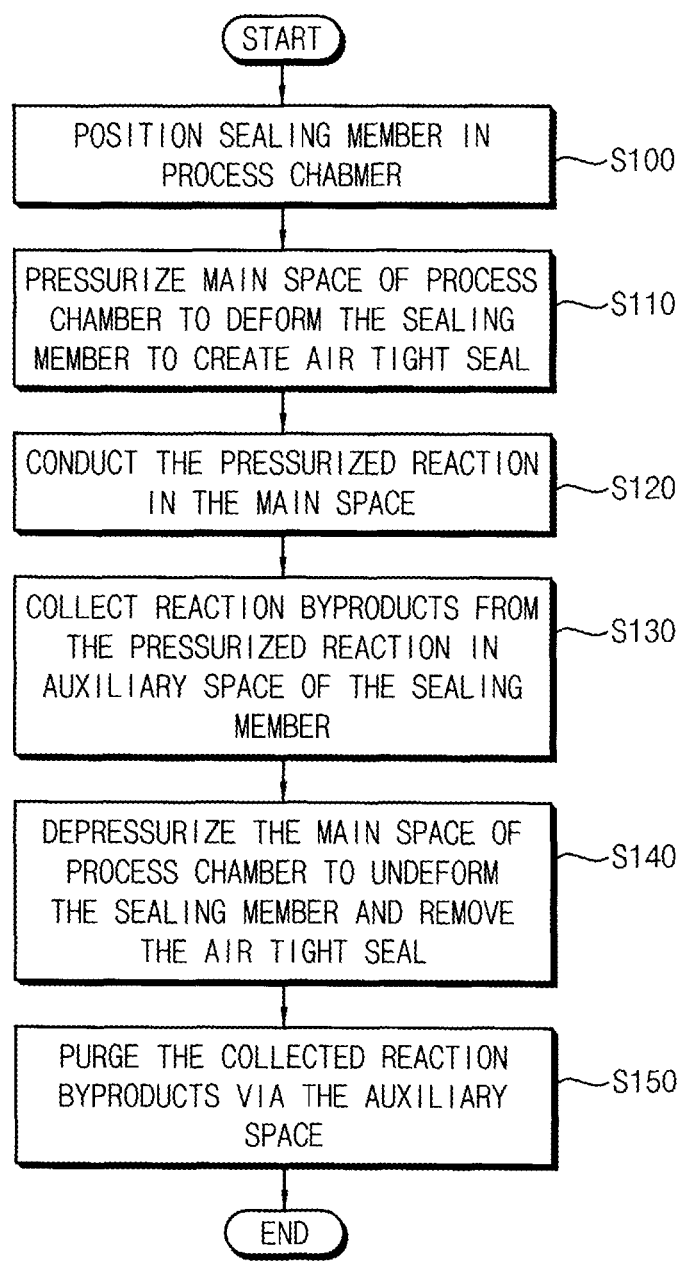

FIG. 8 is a cross-sectional view illustrating a substrate processing apparatus 10 in accordance with some example embodiments. FIG. 9 is an enlarged view illustrating the "A" portion in FIG. 8. FIGS. 10A and 10B are cross-sectional views illustrating shapes of a sealing member 100 when a process is performed in a process chamber of the substrate processing apparatus in FIG. 8. FIG. 11 is a flow chart illustrating a method of decontaminating a process chamber of the substrate processing apparatus 10 in FIG. 8.

Referring to FIGS. 8 to 11, a substrate processing apparatus 10 may include a process chamber providing a space S for processing a substrate, and a sealing member 100 airtightly sealing the space S within the process chamber 200.

In example some embodiments, the process chamber 200 may include a lower chamber 202 and an upper chamber that are combined together to provide the space S. The lower chamber 202 and the upper chamber 204 may move relative to each other by a drive mechanism. For example, the lower chamber 202 and the upper chamber 204 may move relatively to each other along an elevation rod (not illustrated).

The process chamber 200 may provide the space S for performing a manufacturing process of a semiconductor device, i.e., ashing process, cleaning process, developing process, etc. For example, the process chamber 200 may provide a space for performing a drying process on a wet-etch processed wafer (W) using a supercritical fluid. The process chamber 200 may include a temperature and pressure control device for controlling a temperature and a pressure inside the process chamber 200 to provide a supercritical condition for a supercritical fluid process.

In some example embodiments, the substrate processing apparatus 10 may include a substrate supporting member 220 for holding the wafer (W) within the process chamber 200, at least one supply port 230, 232 for supplying a supercritical fluid into the process chamber 200, and at least one exhaust port 240 for exhausting the supercritical fluid from the process chamber 200.

The substrate supporting member 220 may extend from a lower surface of the upper chamber 204 to support the wafer (W) at a predetermined or desired position away from the lower surface of the upper chamber 204 by a predetermined or desired distance. The wafer (W) may be supported by the substrate supporting member 220 such that an upper surface of the wafer (W) faces the lower surface of the upper chamber 204 and a lower surface of the wafer (W) faces a bottom surface of the lower chamber 202.

The at least one supply port 230, 232 may include a first supply port 230 located in the lower chamber 202 and a second supply port 232 located in the upper chamber 204. The first supply port 230 may be positioned in the middle region of the lower chamber 202. The second supply port 232 may be positioned in the middle region of the upper chamber 204. The first supply port 230 may supply a supercritical fluid into an inner portion of the space S towards the lower surface of the wafer (W). The second supply port 232 may supply a supercritical fluid into the inner portion of the space S towards the upper surface of the wafer (W).

The at least one exhaust port 240 may be located in the lower chamber 202. The at least one exhaust port 240 may be located in the middle region of the lower chamber 204 adjacent to the first supply port 230. The supercritical fluid remaining after performing the supercritical fluid process may be discharged through the exhaust port 240 from the process chamber 200. The discharged fluid may include the supercritical fluid having a dissolved organic solvent. The fluid discharged through the exhaust port 240 may be supplied to a regeneration apparatus (not illustrated) to be separated into a supercritical fluid and an organic solvent.

In some example embodiments, the sealing member 100 may be compressed between the upper chamber 204 and the lower chamber 202 to seal the space S. The sealing member 100 may be seated in a receiving groove 210 formed in at least one of the mating surfaces of the lower chamber 202 and the upper chamber 204 opposite to each other. For example, the sealing member 100 may be seated in the receiving groove 210 formed in the upper surface of the lower chamber 202.

The receiving groove 210 may have a bottom face 212, an outer sidewall 214 and an inner sidewall 216. For example, the outer sidewall 214 may extend vertically at a predetermined or desired inclination angle with respect to the bottom face 212, and the inner sidewall 216 may extend vertically at a predetermined or desired inclination angle with respect to the bottom face 212.

The outer sidewall 214 of the receiving groove 210 may have a first height (H1) from the bottom face 212, and the inner sidewall 216 of the receiving groove 210 may have a second height (H2) from the bottom face 212. The second height (H2) may be less than the first height (H1). Accordingly, when the sealing member 100 is seated in the receiving groove 210, an inner upper portion of the sealing member 100 may be exposed through the receiving groove 210.

Referring again to FIGS. 4 and 9, when the sealing member 100 is seated in the receiving groove 210, the lower contacting portion 120 of the sealing member 100 may face and/or contact the bottom face 212 of the receiving groove 210, the outer contacting portion 130 of the sealing member 100 may face and/or contact the outer sidewall 214 of the receiving groove 210, and the inner surface 114 of the body 110 may face and/or contact the inner sidewall 216 of the receiving groove 210.

The at least one recess 122 in the lower surface of the lower contacting portion 120 may form a passage together with the bottom face 212 of the receiving groove 210, and the indentation 132 may form a tunnel space R having an annular shape with the bottom face 212 and the outer sidewall 214 of the receiving groove 210. The tunnel space R may be formed by the indentation 132 in the outer lower portion of the sealing member 100 and the receiving groove 210 in a corner of the bottom face 212 and the outer sidewall 214 of the receiving groove 210. The tunnel space R may be connected to the passage.

FIGS. 10A and 10B represent a deformation of the sealing member 100 and a flow of a fluid while a supercritical fluid process is performed.

In some example embodiments, the supercritical fluid process may be a drying process that dries the substrate such as the wafer (W) using a supercritical fluid. After a material layer such as a mold layer or a sacrificial layer on a substrate is etched an etching mask and is cleaned using a cleaning solution, the substrate may be dried using a supercritical fluid.

For example, the material layer may include silicon oxide such as BPSG (boro-phospho silicate glass), TEOS (tetraethyl orthosilicate), etc. The cleaning solution may include DI (deionized) water or alcohol such as IPA (iso propyl alcohol). The supercritical fluid may include supercritical carbon dioxide. The material layer may have a different material than the above-mentioned material, and the cleaning solution may be selected based the material layer.

After a cleaning process is performed using a cleaning solution such as DI water or IPA on the wafer to remove byproducts of the previous etching process, a drying process may be performed to remove residual IPA on the wafer. After the wafer is loaded into the process chamber 200, the wafer may be dried using supercritical carbon dioxide.

As illustrated in FIG. 10A, after the upper chamber 204 and the lower chamber 202 contact each other, a supercritical fluid may be supplied into the process chamber 200 through the at least one supply ports 230 and 232, and the process chamber 200 may be pressurized under a critical pressure of the supercritical fluid to perform a supercritical drying process.

As the pressure of the process chamber 200 is increased up to several tens or hundreds bars, the sealing member 100 in the receiving groove 210 may be pressured outwards in the radial direction of the sealing member 100, forming sealing contact points C1 and C2 to seal the inner space S.

Particles P in the process chamber 200 may move through a fine space between the inner surface of the sealing member 100 and the inner sidewall 216 of the receiving groove 210 into the passages defined by the recesses 122, and then, may be collected in the tunnel space R that is connected to the passages. The particles P may be reaction byproducts, for example, from a supercritical process.

As illustrated in FIG. 10B, after the supercritical drying process is completed, the pressure of the process chamber may be decreased to air pressure and the fluid used for the supercritical process may be exhausted from the process chamber 200 through the at least one exhaust port 240.

The particles P collected in the tunnel space R may move again through the passages into the space S in the process chamber 200, and then, may be discharged from the process chamber 200 through the at least one exhaust port 240.

According to a conventional sealing member, when the pressure of a process chamber is increased up to a critical point, particles may go into a gap between the sealing member and a receiving groove. After completing the supercritical fluid process, when the process chamber is open, due to a drastic expansion behavior of a medium in the process chamber, the particles could be contamination sources for a following process.

As mentioned above, according to example embodiments, when the pressure of a process chamber is increased, a sealing member may form a tunnel space between the sealing member and a receiving groove so that particles may be intentionally collected in the tunnel space. And then, when the pressure of the process chamber is decreased, the collected particles may move again to the process chamber through a passage of the sealing member and then, may be exhausted from the process chamber. Accordingly, the supercritical fluid process chamber may be reliably sealed without generating process particles in the process chamber.

The foregoing is illustrative of example embodiments and is not to be construed as limiting thereof. Although some example embodiments have been described, those skilled in the art will readily appreciate that many modifications are possible in example embodiments without materially departing from the novel teachings and advantages of the present invention. Accordingly, all such modifications are intended to be included within the scope of example embodiments as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:
1. A sealing member, comprising:
a body having a ring shape;

a lower contacting portion protruding from a lower end of the body and having at least one recess, the recess provided in a lower surface of the lower contacting portion and extending in a radial direction of the body; and an outer contacting portion protruding outwards from the body along an outer side portion of the body.

2. The sealing member of claim 1, wherein a plurality of the recesses is arranged to be spaced apart from each other along a circumferential direction of the body.

3. The sealing member of claim 1, wherein the sealing member comprises an indentation which is defined by a lower surface of the outer contacting portion and an outer surface of the lower contacting portion, the indentation extending in a circumferential direction of the body.

4. The sealing member of claim 3, wherein the indentation is connected to the recess.

5. The sealing member of claim 3, wherein the indentation is provided in an edge of an outer lower portion of the sealing member.

6. The sealing member of claim 3, wherein the recess has a first depth from the lower surface of the lower contacting portion, and the indentation has a second depth from a plane having the lower surface of the lower contact portion, the second depth being substantially the same as or greater than the first depth.

7. The sealing member of claim 1, wherein an outer surface of the outer contacting portion forms an acute inclination angle with respect to a plane of the lower surface of the lower contacting portion.

8. The sealing member of claim 1, wherein an inner side portion of a vertical sectional profile of the sealing member has a linear or curvilinear shape.

9. The sealing member of claim 1, wherein the sealing member comprises polymer material having elasticity.

10. A substrate processing apparatus, comprising:
a process chamber including a lower chamber and an upper chamber which are combined to provide a substrate processing space; and the sealing member of claim 1, the sealing member being configured to be seated in a receiving groove formed in at least one of mating surfaces of the lower chamber and the upper chamber opposite to each other and compressed between the upper chamber and the lower chamber to seal the space.

11. The substrate processing apparatus of claim 10, further comprising:

a supply port supplying a supercritical fluid into the process chamber; and an exhaust port exhausting from the supercritical fluid from the process chamber.

12. The substrate processing apparatus of claim 11, wherein the supply port comprises a first supply port in the lower chamber and a second supply port in the upper chamber.

13. The substrate processing apparatus of claim 11, wherein the exhaust port is in the lower chamber.

14. The substrate processing apparatus of claim 10, further comprising a substrate supporting member provided in the process chamber to support a substrate in the process chamber.

15. The substrate processing apparatus of claim 14, wherein the substrate supporting member extends from a lower surface of the upper chamber.

16. The substrate processing apparatus of claim 10, wherein an outer sidewall of the receiving groove has a first height from a bottom face of the receiving groove, and an inner sidewall of the receiving groove has a second height from the bottom face of the receiving groove.

17. A sealing member, comprising:
a deformable body;
a first contacting portion of the deformable body including at least one recess; and
a second contacting portion of the deformable body including at least one indentation, the at least one recess, the at least one indentation and a receiving groove of a process chamber forming an auxiliary space in which reaction byproducts are collected and exhausted from the process chamber.

18. The sealing member of claim 17, wherein a plurality of the recesses is arranged to be spaced apart from each other along a circumferential direction of the body.

19. The sealing member of claim 17, wherein the at least one indentation is provided in an edge of the second contacting portion of the sealing member.

20. The sealing member of claim 19, wherein the at least one recess has a first depth from a lower surface of the first contacting portion, and the indentation has a second depth from a plane having the lower surface of the first contact portion, the second depth being substantially the same as or greater than the first depth.

* * * * *